United States Patent
Nakano et al.

[11] Patent Number: 6,153,444
[45] Date of Patent: *Nov. 28, 2000

[54] METHOD OF MEASURING FREE CARRIER CONCENTRATION AND/OR THICKNESS OF A SEMICONDUCTOR AND PROCESS OF MANUFACTURING SEMICONDUCTOR DEVICE AND SEMICONDUCTOR WAFER USING SUCH METHOD

[75] Inventors: Hiroyuki Nakano, Omihachiman; Kenji Taniguchi, Suita, both of Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/921,829

[22] Filed: Sep. 2, 1997

[30] Foreign Application Priority Data

Sep. 2, 1996 [JP] Japan ............................ 8-250935
Aug. 7, 1997 [JP] Japan ............................ 9-227470

[51] Int. Cl.$^7$ .................................................. H01L 21/66
[52] U.S. Cl. .................... 438/16; 438/14; 438/17; 438/18
[58] Field of Search .................... 438/14, 16, 17, 438/18

[56] References Cited

U.S. PATENT DOCUMENTS

| | | | |
|---|---|---|---|
| 3,645,631 | 2/1972 | Gupta | 356/136 |
| 4,332,833 | 6/1982 | Aspnes et al. | 438/16 |
| 4,472,633 | 9/1984 | Motooka | 250/338.1 |
| 4,953,983 | 9/1990 | Bottka et al. | |
| 5,232,547 | 8/1993 | Drowley et al. | 117/55 |
| 5,270,536 | 12/1993 | Malhotra | |
| 5,595,916 | 1/1997 | Fujimura et al. | 438/16 |
| 5,604,581 | 2/1997 | Liu et al. | 356/73 |

FOREIGN PATENT DOCUMENTS 0631304  12/1994  European Pat. Off.

OTHER PUBLICATIONS

Patent Abstracts of Japan, vol. 018, No. 359, Jul. 6, 1994 & JP 06 097253 A (New Japan Radio Co Ltd; Others: 01), Apr. 8, 1994 (Abstract).

*Primary Examiner*—Carl Whitehead, Jr.
*Assistant Examiner*—Maria Guerrero
*Attorney, Agent, or Firm*—Ostrolenk, Faber, Gerb & Soffen, LLP

[57] ABSTRACT

The invention provides a method of measuring a carrier concentration and/or thickness of a semiconductor, which includes the steps of determining the carrier concentration by optical measurement means using a light having at least a frequency band which causes light absorption by free carriers in the semiconductor. A reflection amplitude ratio and a phase of the light or the result of measurement of substitute parameters therefor are obtained by the optical measurement means, and the carrier concentration and/or thickness is determined based on the reflection amplitude ratio and the phase or said result of measurement of the substitute parameter therefor.

6 Claims, 7 Drawing Sheets

METHOD OF MEASURING FREE CARRIER CONCENTRATION AND/OR THICKNESS OF A SEMICONDUCTOR AND PROCESS OF MANUFACTURING SEMICONDUCTOR DEVICE AND SEMICONDUCTOR WAFER USING SUCH METHOD

BACKGROUND OF THE INVENTION

1. Field of the Invention

The present invention relates to a method of measuring a carrier concentration of a semiconductor, a process for manufacturing a semiconductor device and a semiconductor wafer. Particularly, the present invention relates to an inspection technique in a process of manufacturing a semiconductor device, and a technique for measuring the carrier concentration and the thickness of a semiconductor active layer to which impurities are added, or the profile of carrier concentrations thereof. Also the present invention relates to a semiconductor wafer inspected by using the measuring method.

2. Description of the Related Art

Conventional Method of Measuring a Profile of Carrier Concentrations

One of the important evaluation tests for manufacturing semiconductor devices is measurement of a profile of carrier concentrations. Generally, the profile of carrier concentrations of a semiconductor is measured by utilizing capacity-voltage (C-V) characteristics of a junction. This C-V method is a method in which a sample having a pn junction, a Schottky junction, or a MOS structure is formed, the thickness (=the depth of a measurement region from a junction) of a depletion layer is controlled by applying a DC vias voltage to a test signal of a capacity meter, and a profile of carrier concentrations is determined from changes in the capacity value.

However, in the C-V method, a profile of carrier concentrations is measured by a destructive test, and it is thus necessary to form a sample wafer for an evaluation test separately from products of the same lot in an actual semiconductor device manufacturing line for manufacturing products, and measure a profile of carrier concentrations by using the sample wafer separately formed. Alternatively, a portion of a wafer for manufacturing semiconductor a device as a product is divided, and a fraction is sacrificed for evaluation measurement.

Such a destructive test is incapable of inspecting semiconductor devices to be actually shipped as products, and thus has a problem in that accurate evaluation cannot be made due to the influences of variations in products and a distribution in the process. It is also necessary to separately form a sample wafer for an evaluation test, or divide a wafer sampled from the manufacturing line and use a fraction thereof. There is thus the problem of requiring much labor and time for preparation for measurement.

In some cases, no measurement is carried out. However, in such cases, there is the possibility of causing a problem with the reliability of a semiconductor device as a product.

Besides the above-mentioned C-V method, there are methods for determining a profile of carrier concentrations, including hole measurement for evaluating a depthwise profile of carrier concentrations by employing a hole effect, a SIMS (Secondary Ion Mass Spectrometry) method in which an impurity profile is measured and then converted into a profile of carrier concentrations, etc. However, these methods are destructive methods accompanied with destruction of a sample and thus have the same problems as the above-described C-V method.

Ellipsometry as a Method of Measuring Film Thickness

On the other hand, in a process for manufacturing semiconductor devices, ellipsometry is frequently used as a non-contact method of measuring a film thickness. This method is a method in which a reflection amplitude ratio between the reflectance ($R^S$) of a vibration component parallel to the plane of incidence of polarized light reflected by each of a plurality of critical faces of a thin film layer formed on the surface of a material and the reflectance ($R^P$) of a vibration component perpendicular to the plane of incidence, and a phase difference therebetween are measured to determine a film thickness and a refractive index. A film thickness can be known by ellipsometry, but a carrier concentration cannot be known thereby. Ellipsometry using normal visual light can be applied to measurement of the thicknesses of films of materials having different refractive indexes, such as an oxide film and a heteroepitaxial layer which are formed on a semiconductor substrate. However, the thickness of a homoepitaxial layer such as a GaAs layer containing n-type impurities and epitaxially grown on a semi-insulating GaAs substrate cannot be measured by ellipsometry.

SUMMARY OF THE INVENTION

The present invention has been achieved in consideration of the above-described technical background, and an object of the present invention is to provide a non-contact, non-destructive method of measuring the carrier concentration of a semiconductor, and particularly to improve ellipsometry which is conventionally used as a method of measuring the thickness of a thin film layer so as to enable not only measurement of a film thickness but also determination of a carrier concentration and a profile of carrier concentrations, and non-contact, non-destructive evaluation of the carrier concentration and the profile of carrier concentrations of a semiconductor.

Another object of the present invention is to provide a process for manufacturing a semiconductor device which is capable of manufacturing a high-reliability semiconductor device by using a method of measuring the carrier concentration of a semiconductor of the present invention.

The invention provides a method of measuring a carrier concentration of a semiconductor, comprising the steps of determining said carrier concentration by optical measurement means using a light having at least a frequency band which causes light absorption by free carriers in said semiconductor.

In the above method, a reflection amplitude ratio and a phase of said light or the result of measurement of a substitute therefor may be obtained by said optical measurement means, and said carrier concentration may be determined based on said reflection amplitude ratio and said phase or said result of measurement of the substitute therefor.

The carriers may be either the p-type or n-type. The result of measurement of the substitute for the reflection amplitude ratio and the phase includes a complex amplitude reflectance ratio, physical quantities obtained from the reflection amplitude ratio and the phase, and physical quantities from which the reflection amplitude ratio and the phase can be determined.

In the above methods, relational expressions between said carrier concentration, and an index of refraction and an absorption coefficient of said semiconductor may be used for determining said carrier concentration of said semiconductor.

The above methods are capable of measuring the carrier concentration of a semiconductor in a non-contact, non-destructive manner. Namely, since absorption of light changes with the amount of free carriers in a semiconductor, the use of light in a frequency band where absorption of light occurs due to the free carriers, or a frequency band containing at least the frequency band permits non-contact, non-destructive measurement of the carrier concentration of the semiconductor by detecting the effect of a change in light absorption and analyzing the results of detection.

In the above methods, said optical measurement means employs ellipsometry.

The ellipsometry is capable of measuring the thickness of a semiconductor film, and thus enables non-contact, non-destructive, simultaneous measurement of the carrier concentration and the thickness of a film.

In the above methods, when said semiconductor has a multilayer structure, each carrier concentration of the layers of said semiconductor can be determined.

Even when the semiconductor has a multilayer structure comprising layers having different carrier concentrations, the carrier concentration and the thickness of each layer can be determined by analyzing in turn the respective layers.

In the above methods, the distribution in the thickness direction of said carrier concentration of said semiconductor may be determined.

When the carrier concentration changes in the semiconductor, the semiconductor is divided in the thickness direction thereof to be considered as having a multilayer structure, and the profile in the thickness direction of carrier concentrations can thus be determined.

In the above methods, when errors between the measured reflection amplitude ratio and phase or the result of measurement of the substitute therefor, and a calculated reflection amplitude ratio and phase or a result of measurement of a substitute therefor by using assumed arbitrary carrier concentration and thickness fall within permissible limits, said assumed carrier concentration and thickness can be considered as measurements.

This method is capable of easily determining a carrier concentration and a film thickness (or a profile of carrier concentrations) within a short time, as compared with determination of a carrier concentration and a film thickness (or a profile of carrier concentrations) by solving relational expressions, thereby significantly decreasing the time required for measurement.

The invention further provides a process of manufacturing a semiconductor device comprising the steps of controlling a process of forming a semiconductor active layer by using one of the above described methods.

When the method of measuring the carrier concentration of the present invention is performed in the process for manufacturing a semiconductor device, it is possible to carry out in-situ inspection for all wafers, and thus accurately, precisely perform process control, and securely eliminate a wafer in which a defective active layer is formed. It is also possible to obtain results of inspection within a short time, and thus improve the throughput of the process for manufacturing semiconductor devices.

The invention further provides a semiconductor wafer inspected by using one of the above described methods, and subjected to performance guarantee by using the results of inspection.

The semiconductor wafer whose performance is guaranteed as described above exhibits higher reliability than a wafer whose performance is guaranteed by destructive inspection using the characteristic values obtained from another wafer.

Other features and advantages of the present invention will become apparent from the following description of the invention which refers to the accompanying drawings.

DETAILED DESCRIPTION OF THE PREFERRED EMBODIMENTS

Construction of Ellipsometric Apparatus

Figure 1:
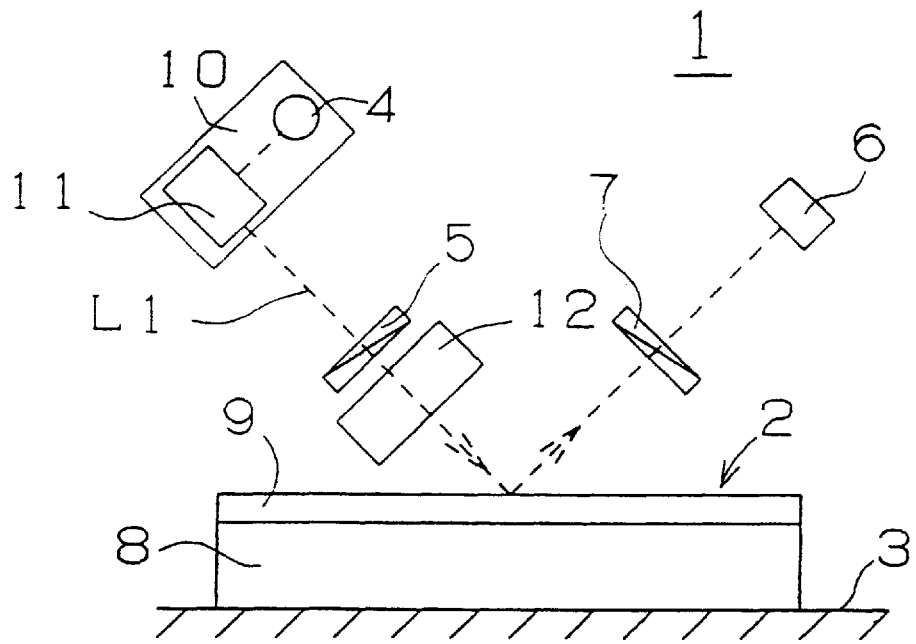
FIG. 1 is a schematic view showing the construction of an ellipsometric apparatus in accordance with an embodiment of the present invention.

A construction and a principle for carrying out the method of measuring carrier concentrations using ellipsometry in accordance with the present invention will be described below with reference to the drawings. FIG. 1 is a schematic view showing the construction of an ellipsometric apparatus 1 used for measurement of a carrier concentration in accordance with the present invention. An FT-IR (Fourier Transform-Infrared) spectrometer 10 is disposed above a processing apparatus 3 on which a substrate 2 as a measurement object is mounted. The FT-IR spectrometer 10 comprises a light source 4 such as a SiC lamp or the like, and a Michelson interferometer 11. The light (infrared light) L1 emitted from the light source 4 passes through the Michelson interferometer 11, and is then obliquely incident on the surface of the substrate 2 as the measurement object through a polarizing plate 5 and a modulator 12. A light receiving device 6 such as a HgCdTe light detector or the like is provided, and a polarizing plate (light detecting plate) 7 is provided in front of the light receiving device 6 in the direction of receiving the light reflected by the substrate 2 as the measurement object. The polarizing plates 5 and 7 are adjusted so that the axis of polarization is in an appropriate direction around the optical axis according to the type of the substrate 2 as the measurement object. The ellipsometric apparatus 1 comprises the Michelson interferometer 11 provided behind the light source 4 such as a SiC lamp or the like so that spectra are determined by Fourier transform processing in spectroscopy. In the infrared region, since spectroscopy performed in the visible light region cannot be carried out, the above-mentioned construction permits infrared spectroscopic ellipsometry. The substrate 2 as the measurement object is, for example, a semi-insulating GaAs substrate on which an n-type GaAs epitaxial layer (an active layer, etc.) is formed, or a Si substrate on which an n-type or p-type Si layer (active material, etc.) is formed.

Principle of Ellipsometry

Figure 2:
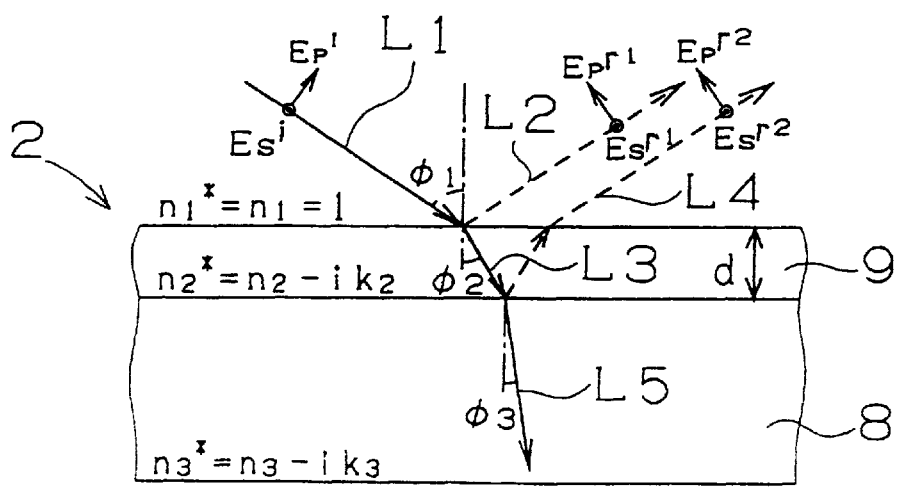
FIG. 2 is a view illustrating the principle of the same ellipsometry.
Figure 5A:
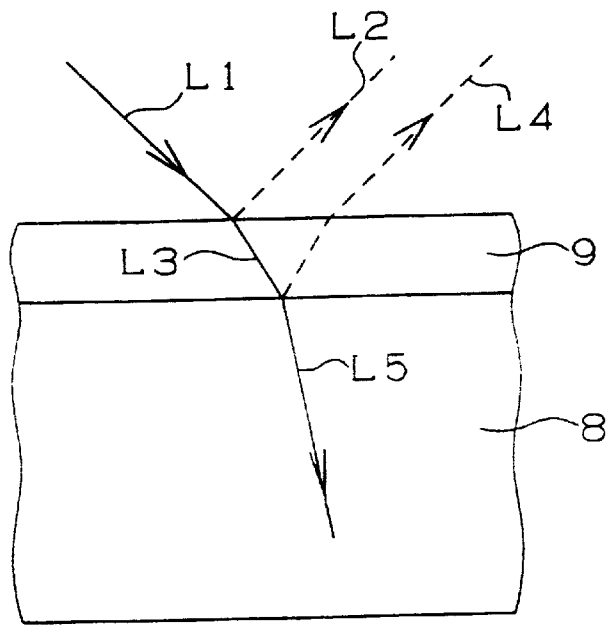
FIG. 5($a$) is a schematic view illustrating the principle of the present invention, and FIG. 5($b$) is a schematic view showing a comparative example.

FIG. 2 is a view illustrating a state wherein a carrier-doped semiconductor layer 9 formed on a semiconductor substrate 8 is measured by the ellipsometric apparatus 1. The incident light (collimated light) L1 which is emitted from the light source 4 and linearly polarized by the polarizing plate 5 is incident at an angle $\phi_1$ of incidence on the surface of the carrier-doped semiconductor layer 9 on the substrate 2 as the measurement object. Part of the light is reflected from the surface of the carrier-doped semiconductor layer 9 to become reflected light L2 (elliptically polarized light), and another part thereof is transmitted through the carrier-doped semiconductor layer 9 (thickness d) and incident on the interface between the carrier-doped semiconductor layer 9 and the semiconductor substrate 8 (an angle $\phi_2$ of refraction). Part of the transmitted light L3 incident on the interface between the carrier-doped semiconductor layer 9 and the semiconductor substrate 8 is reflected by the interface and passed through the interface between the carrier-doped semiconductor layer 9 and air to become reflected light L4, and another part is further incident on the semiconductor substrate 8 to become transmitted light L5 (an angle $\phi_3$ of refraction). Here, the complex index of refraction of air is represented by $n_1^* = n_1 = 1$ ($n_1$ is a refractive index), the complex index of refraction of the carrier-doped semiconductor layer 9 is represented by $n_2^* = n_2 - ik_2$ ($n_2$ is a refractive index, and $k_2$ is an absorption coefficient), and the complex index of refraction of the semiconductor substrate 8 is represented by $n_3^* = n_3 - ik_3$ ($n_3$ is a refractive index, and $k_3$ is an absorption coefficient). The reflected light L2 reflected by the surface of the carrier-doped semiconductor layer 9 and the reflected light L4 reflected by the interface between the semiconductor substrate 8 and the carrier-doped semiconductor layer 9 are passed through the polarizing plate 7 and then received by the light receiving device 6. In fact, besides the primary reflective light L2 and L4, there are present multiple reflected light reflected a plurality of times by the surface and back of the carrier-doped semiconductor layer 9, and such multiple reflected light is also received by the light receiving device 6. However, in order to avoid complication, FIG. 2 (the same is true for FIGS. 5 and 6 described below) shows only the primary reflected light L2 and L4 reflected once by the surface and back of the carrier-doped semiconductor layer 9, respectively. Although equations (4) to (6), (15) and (16) which will be described below are obtained as a result of consideration of multiple reflected light, in order to simplify the description, multiple reflected light is not described in the description and the computation dealing with obtaining these equations. Notwithstanding this, in the description below, it is to be understood that the reflected light L2 and L4 contain multiple reflected components.

As shown in FIG. 2, the electric field vector of a polarized light component (referred to as "P wave" hereinafter) in the axis (P axis) direction parallel to the plane of incidence and perpendicular to the optical axis is $E_P$, the electric field vector of a polarized light component (referred to as "S wave" hereinafter) in the axis (S axis) direction perpendicular to the P axis and the optical axis is $E_S$, and incident light and reflected light are discriminated by showing superscripts i and r1 and r2, respectively. In this case, the Fresnel reflection coefficients $R^P$ and $R^S$ of the P wave and S wave reflected by the surface of the carrier-doped semiconductor layer 9 are represented by the following equation (1):

$$R^P = E_P{}^r / E_P{}^i$$

$$R^S = E_S{}^r / E_S{}^i \qquad (1)$$

Since $E_P{}^r$ includes the electric field vectors of the P waves of the reflected light L2 reflected by the surface of the carrier-doped semiconductor layer 9 and of the reflected light L4 reflected by the interface between the carrier-doped semiconductor layer 9 and the semiconductor substrate 8, and $E_S{}^r$ includes the electric field vectors of the S waves of the reflected light L2 reflected by the surface of the carrier-doped semiconductor layer 9 and of the reflected light L4 reflected by the interface between the carrier-doped semiconductor layer 9 and the semiconductor substrate 8, the following equations are obtained:

$$E_P{}^r = E_P{}^{r1} + E_P{}^{r2}$$

$$E_S{}^r = E_S{}^{r1} + E_S{}^{r2} \qquad (2)$$

In the ellipsometry, generally, the magnitude (=reflection amplitude ratio) tan $\Psi$ of the complex amplitude reflectance ratio $\rho$ and the phase $\Delta$ are obtained as results of measurement, and the complex amplitude reflectance ratio $\rho$ of the P wave to the S wave at the time of reflection by the surface of the carrier-doped semiconductor layer 9 as an object is represented by the ratio of $R^P$ to $R^S$. Namely, using the equation (1), the ratio can be represented as follows:

$$\rho = R^P / R^S = (E_P{}^r \cdot E_S{}^i) / (E_P{}^i \cdot E_S{}^r) \qquad (3)$$

In consideration of the boundary conditions for the incident light L1, the transmitted light L3, and the reflected light L2 and L4 on the interface between the air layer and the carrier-doped semiconductor layer 9, and the boundary conditions for the transmitted light L3 and L5, and the reflected light L4 on the interface between the carrier-doped semiconductor layer 9 and the semiconductor substrate 8, if the wavelength of the light used for measurement is $\lambda$, the complex amplitude reflectance ratio $\rho$ of the P wave to the S wave at the time of reflection by the surface of the carrier-doped semiconductor layer 9 is represented by the following equation (4):

$$\rho = \frac{R^P}{R^S} \qquad (4)$$

$$= \frac{r_1^P + r_2^P \cdot \exp(-2i\delta)}{1 + r_1^P \cdot r_2^P \cdot \exp(-2i\delta)} \cdot \frac{1 + r_1^S \cdot r_2^S \cdot \exp(-2i\delta)}{r_1^S + r_2^S \cdot \exp(-2i\delta)}$$

wherein $$r_1^P = \frac{n_2^* \cos\phi_1 - n_1^* \cos\phi_2}{n_1^* \cos\phi_2 + n_2^* \cos\phi_1} \qquad (5)$$

$$r_2^P = \frac{n_3^* \cos\phi_2 - n_2^* \cos\phi_3}{n_2^* \cos\phi_3 + n_3^* \cos\phi_2}$$

$$r_1^S = \frac{n_1^* \cos\phi_1 - n_2^* \cos\phi_2}{n_1^* \cos\phi_1 + n_2^* \cos\phi_2}$$

$$r_2^S = \frac{n_2^* \cos\phi_2 - n_3^* \cos\phi_3}{n_2^* \cos\phi_2 + n_3^* \cos\phi_3}$$

$$\delta = 2\pi \frac{d}{\lambda}\sqrt{(n_2^*)^2 - \sin^2\phi_1} \qquad (6)$$

Also the angle $\phi_1$ of incidence, the angle $\phi_2$ of refraction and the indexes $n_1$ and $n_2$ of refraction on the surface of the carrier-doped semiconductor layer 9 have the relation of the following Snell's law:

$$n_1 \cdot \sin\emptyset_1 = n_2 \cdot \sin\emptyset 2 \qquad (7)$$

Since the ellipsometric apparatus 1 is capable of obtaining the magnitude tan $\Psi$ of the complex amplitude reflectance ratio $\rho$ and the phase $\Delta$ as functions of the wavelength $\lambda$ of the light used (or the angular frequency $\omega$ and wave number of the light used for measurement), as a result of measurement by the ellipsometric apparatus 1, the complex amplitude reflectance ratio $\rho$ can be obtained as follows:

$$\rho \equiv \tan\Psi \cdot \exp(i\Delta) \qquad (8)$$

Therefore, if the complex amplitude reflectance ratio $\rho$ can be obtained by measuring the values of $\Psi$ and $\Delta$ by optical measurement using ellipsometry, in principle, the unknown variables in equations (4) to (7) can be determined by solving equations (4) to (7) as simultaneous equations. Specifically, if the complex indexes $n_1^*$ and $n_3^*$ of refraction are known (in this case, since $n_1^*$ is the complex index of refraction of the air layer, $n_1^*=1$, and the complex index of refraction of the semiconductor substrate 8 can be expressed by $n_3^* = \sqrt{(\in_{opt})}$ wherein $\in_{opt}$ is the dielectric constant in a high frequency region described below), the unknown variables are substantially the index $n_2$ of refraction, the absorption coefficient $k_2$ and the thickness d of the carrier-doped semiconductor layer 9. As a result, these unknown letters $n_2$, $k_2$ and d can be determined by measuring the values of $\Psi$ and $\Delta$ by ellipsometry.

The above-mentioned ellipsometry is generally known ellipsometry and is used as a method of measuring the film thickness of a semiconductor thin film layer.

Ellipsometry Improved by the Invention

In the present invention, conventional ellipsometry is improved so that a carrier concentration can be determined by employing the phenomenon that when light is absorbed by the free carriers in the carrier-doped semiconductor layer 9, a difference occurs in the complex index of refraction due to a difference in the carrier concentration. The principle of this method will be described below.

If free carriers are present in the carrier-doped semiconductor layer 9, light is absorbed by the free carriers, and thus the complex index $n_2^*$ of refraction of the carrier-doped semiconductor layer 9 changes with the carrier concentration $N_c$ of the free carriers, and is represented by the following equation (9) or (10):

$$(n_2^*)^2 = \in_{opt}\left(1 - \frac{\omega_P^2}{\omega^2 + i\omega\gamma_{pl}}\right) \qquad (9)$$

or, real number component $$n_2^2 - k_2^2 = \in_{opt}\left(1 - \frac{\omega_P^2}{\omega^2 + \gamma_{pl}^2}\right)$$

complex number component $$2n_2 k_2 = \frac{\in_{opt}\omega_P^2 \gamma_{pl}}{\omega(\omega^2 + \gamma_{pl}^2)} \qquad (10)$$

wherein plasma angular frequency $$\omega_P^2 = \frac{N_c e^2}{m* \in_{opt} \in_0} \qquad (11)$$

The equation (9) or (10) is a generally used equation which indicates absorption of light by free carriers.

The symbols used in equations (9) to (11) are as follows:
$n_2^*$: the complex index of refraction of the carrier-doped semiconductor layer
$\omega$: the angular frequency of the light used for measurement
$\omega_P$: plasma angular frequency
$N_c$: carrier concentration
$\gamma_{pl}$: damping constant of plasma resonance
$\in_{opt}$: the dielectric constant of a semiconductor in a frequency region much higher than the frequency of the light used for measurement
$\in_0$: the dielectric constant in vacuum
$m^*$: the effective mass of carriers
$e$: charge elementary quantity As the values of the effective mass $m^*$ of carriers and the dielectric constant $\in_{opt}$ used in equations (9) to (11), the values described in existing documents and data can be used in accordance with the type of the semiconductor material used for the substrate 2 as the measurement object. Therefore, equation (9) (or equation (10)) and equation (11) indicate the relation between the complex index $n_2^*$ of refraction, the carrier concentration $N_c$ and the damping constant $\gamma_{pl}$ of the carrier-doped semiconductor layer 9. In other words, the use of these equations permits conversion of the unknown variables $n_2$, $k_2$ and d in ellipsometry into $N_c$, $\gamma_{pl}$ and d. Hence, when the values of the carrier concentration $N_c$, the thickness d and the damping constant $\gamma_{pl}$ are determined so as to satisfy the equations (4) to (8), equation (9) (or equation (10)) and equation (11) by using the values of $\Psi$ and $\Delta$ determined by the ellipsometric apparatus 1 using light in a wavelength region, the carrier concentration $N_c$ and the thickness d of the carrier-doped semiconductor layer 9 can simultaneously be measured by ellipsometry.

However, in measurement using a single wavelength, unknown variables cannot be determined because the number of the unknown variables is larger than the number of independent equations. It is thus necessary to perform multiple point measurement (spectroscopic ellipsometry) in a wavelength region for measurement. Also it is difficult to actually determine the values of the carrier concentration $N_c$, the thickness d and the damping constant $\gamma_{pl}$ by considering equations (4) to (8), equation (9) (or equation (10)) and equation (11) as simultaneous equations.

Therefore, when the carrier concentration $N_c$ and the thickness d of the carrier-doped semiconductor layer 9 are determined, $\Psi$ and $\Delta$ are measured at several points with a plurality of wavelengths by ellipsometry, and the carrier concentration $N_c$, the thickness d and the damping constant $\gamma_{pl}$ are preferably determined by a curve fitting method such as a method of least square, a method of steepest descent or the like for the dependencies of $\Psi$ and $\Delta$ on wavelength.

In the curve fitting method, the complex amplitude reflectance ratio ρ is determined as a function of the angular frequency ω of light by measured values Ψm and Δm of Ψ and Δ, as shown by the following equation:

$$\rho m(\omega) = \tan[\Psi m(\omega)] \cdot \exp[i\Delta m(\omega)] \quad (12)$$

The complex amplitude reflectance ratio ρ is determined by selecting appropriate values of the carrier concentration $N_c$, the thickness d and the damping constant $\gamma_{pl}$ of the carrier-doped semiconductor layer 9 and computation according to equation (4), etc, as shown by the following equation:

$$\rho c(\omega) = \tan[\Psi c(\omega)] \cdot \exp[i\Delta c(\omega)] \quad (13)$$

In the method of least square or the method of steepest descent, the residual sum of squares of each of the real part and the imaginary part of each of the complex amplitude reflectance ratios ρm and ρc is determined as an error evaluation function. When the error evaluated by the error evaluation function is lower than a permissible value, it is decided that curve fitting succeeds, and the carrier concentration $N_c$, the thickness d and the damping constant $\gamma_{pl}$ at this time are considered as measurements.

Also another curve fitting method is possible in which the residual sum of squares is determined by using the measured values (Ψm and Δm) and computed values (Ψc and Δc) of Ψ and Δ in place of the complex amplitude reflectance ratio ρ. However, in this case, weighing is required in accordance with the magnitude of tan Ψ. Curve fitting can also be made by using the light intensity of the light receiving device 6 which is used as the base of measurement of Ψ and Δ.

Figure 3:
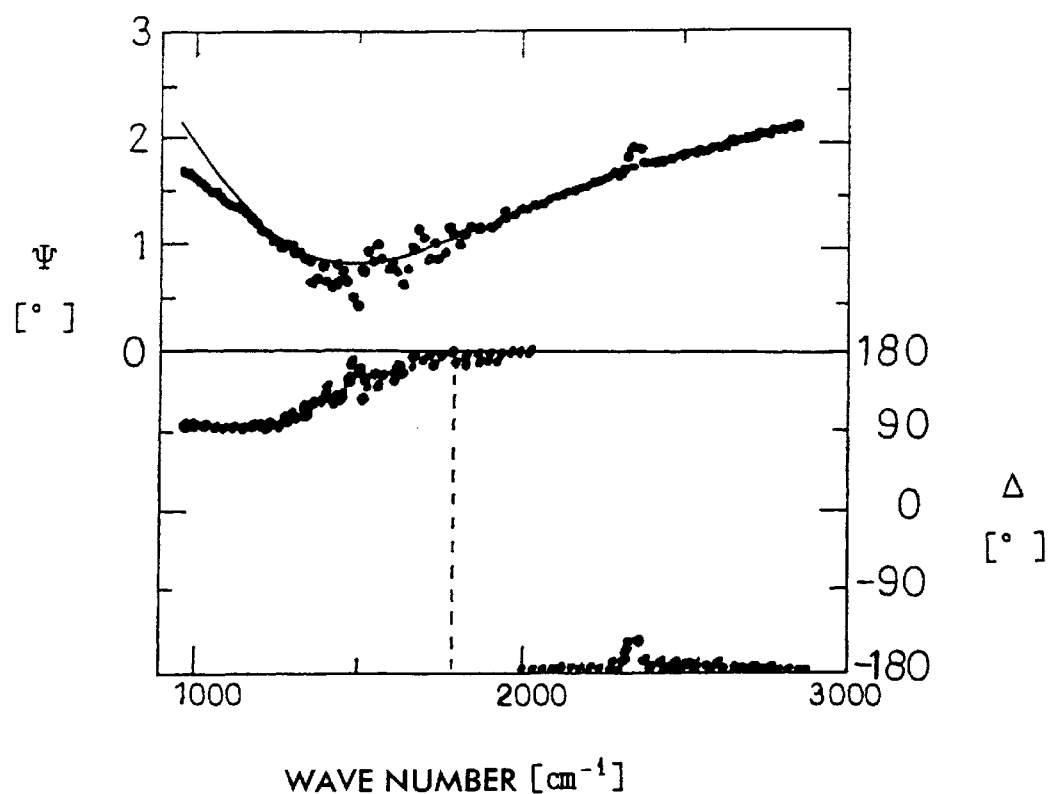
FIG. 3 is a graph showing an example of measurements of $\Psi$ and $\Delta$.

FIG. 3 shows an example of the curve fitting method. In the upper half of FIG. 3, the wave number dependency of the Ψm values measured by ellipsometry is shown by dots, and the wave number dependency of the Ψc values computed by using appropriate values of the carrier concentration $N_c$, the thickness d and the damping constant $\gamma_{pl}$ is shown by a solid curve. In the lower half of FIG. 3, the wave number dependency of the Δm values measured by ellipsometry is shown by dots, Δc jumping from 180° to −180° at a wave number of about 2000 cm$^{-1}$. On the other hand, the wave number where a jump occurs in the computed values Δc is shown by a broken line. Intuitively, the curve fitting method is a method in which when the curves (the dots in FIG. 3) of the measured values Ψm and Δm or the complex plane of the measured values ρm substantially agree with the curves (the solid curve in FIG. 3) of the computed values Ψc and Δc or the complex plane of the computed values ρc when appropriate values of the carrier concentration $N_c$, the thickness d and the damping constant $\gamma_{pl}$ are assumed, the values of the carrier concentration $N_c$, the thickness d and the damping constant $\gamma_{pl}$ are used as measurements.

For example, for the carrier-doped semiconductor layer 9 (epitaxial layer) in which the measured values of the carrier concentration $N_c$ and the thickness d obtained by the C-V method are 6.2×10$^{18}$ cm$^{-3}$ and 380 nm, respectively, when the carrier concentration $N_c$ and the thickness d were determined by the curve fitting method using the values of Ψ and Δc obtained by ellipsometry, good results of $N_c$=6.3×10$^{18}$ cm$^{-3}$ and the thickness d=370 nm could be obtained in a non-contact, non-destructive manner.

Processing Flow of Curve Fitting Method

Figure 4:
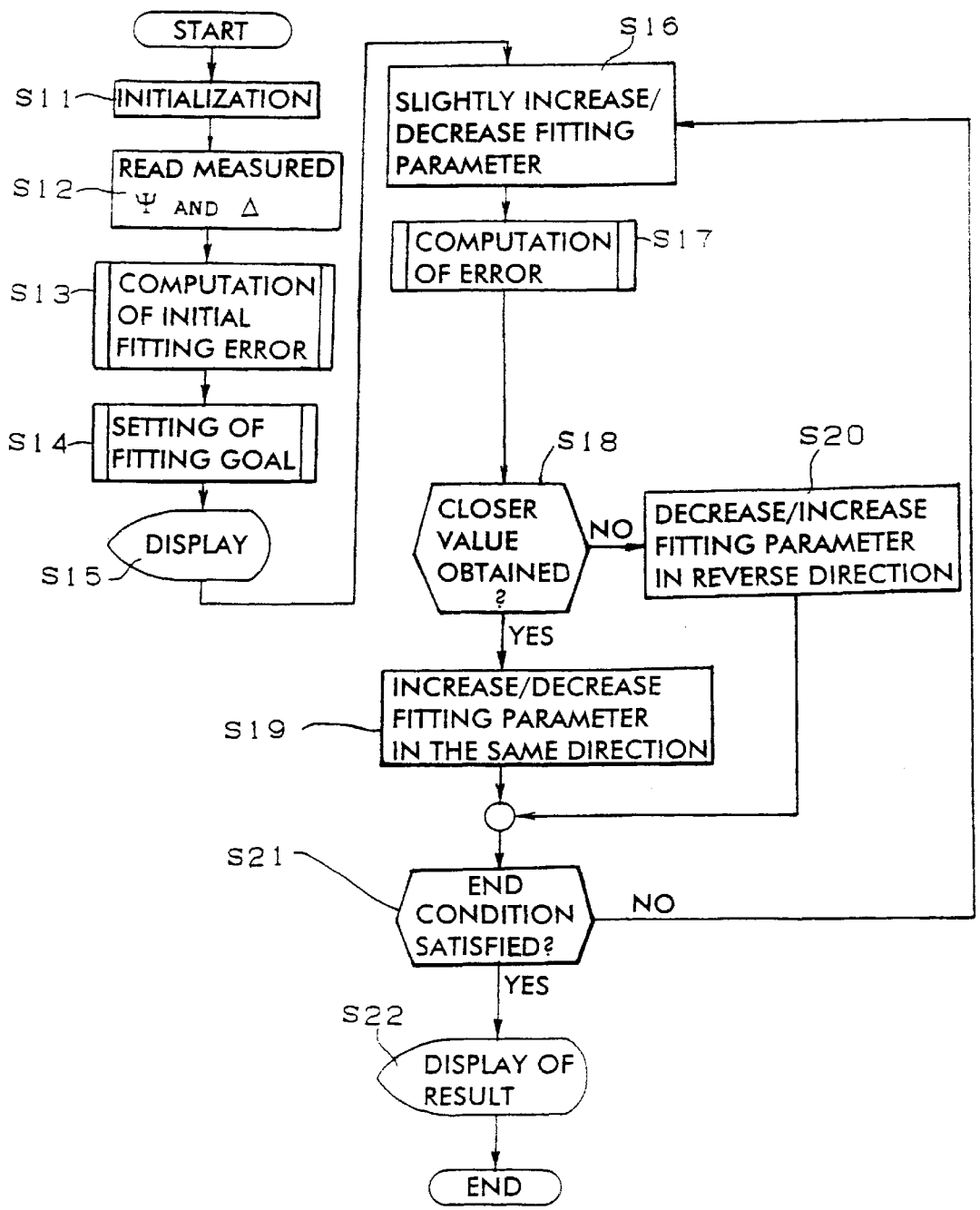
FIG. 4 is a schematic flowchart showing the processing flow of a curve fitting method.

FIG. 4 is a flowchart showing a processing procedure for executing the curve fitting method by a computer using Ψ and Δ as error evaluation functions. In this processing, the values of the carrier concentration $N_c$, the thickness d and the damping constant $\gamma_{pl}$ are determined by changing the values of the carrier concentration $N_c$, the thickness d and the damping constant $\gamma_{pl}$ as fitting parameters so that differences between the measured values Ψm and Δm and the computed valued Ψc and Δc determined by using the fitting parameters are minimized.

Namely, when processing is started, processed data in memory is erased for initialization (S11), and the values of Ψm and Δm measured by ellipsometry are read in the memory (S12). Then, when initial values of arbitrarily selected fitting parameters (the carrier concentration $N_c$, the thickness d and the damping constant $\gamma_{pl}$) are input, the computed values Ψc and Δc are computed from the values of the fitting parameters in accordance with a predetermined computation flow (not shown), and initial values of fitting errors between the measured values Ψm and Δm and the computed values Ψc and Δc are computed (error evaluation) (S13). Then, when a fitting goal (a permissible value of error) is set (S14), the measured values, the computed values, and the fitting parameters are displayed on a display device (S15).

The value of each of $N_c$, d and $\gamma_{pl}$ as the fitting parameters is then slightly increased or decreased (S16), and fitting errors are again computed (S17). The fitting errors before and after recomputation are compared, and a decision is made as to whether computed values Ψc and Δc having lower errors from the measured values Ψm and Δm can be obtained (S18).

When values closer to the measured values than the values before recomputation are obtained, the fitting parameters are changed in the same direction as in Step S16 (S19). When the computed values Ψc and Δc are further from the measured values Ψm and Δm than the values before recomputation, the fitting parameters are changed in the direction reverse to that in Step S16 (S20), and a decision is made as to whether the predetermined end conditions are satisfied, (i.e., whether the error evaluation functions are lower than the predetermined permissible value) (S21). If the end conditions are satisfied, the carrier concentration $N_c$, the thickness d and the damping constant $\gamma_{pl}$ at this time are displayed as measurement results (S22), and processing is completed.

If the end conditions are not satisfied, the flow returns to Step S16, and the fitting parameters are again increased or decreased. Processing in Steps 10 to 21 is repeated until the end conditions are satisfied.

Figure 5B:
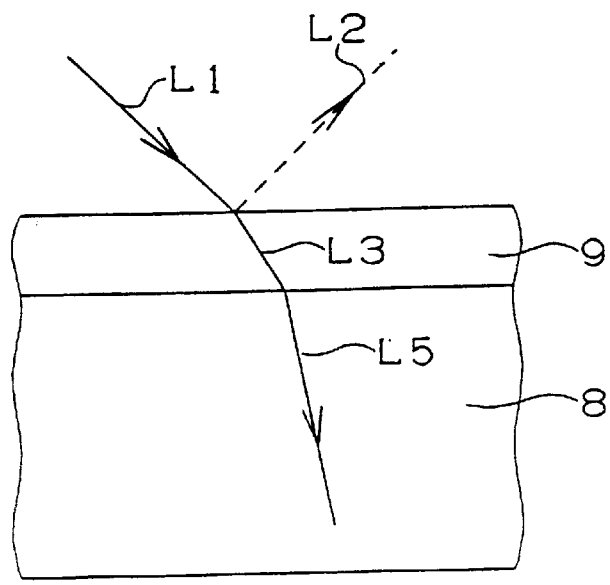

In conventional ellipsometry, no consideration is given to the wavelength of the light used, and visible light is generally used. In measurement with a wavelength which causes no light absorption by the free carriers of the carrier-doped semiconductor layer 9, the light L1 incident on the surface of the carrier-doped semiconductor layer 9 is reflected only by the surface of the carrier-doped semiconductor layer 9, and is not reflected, refracted and absorbed at the interface between the carrier-doped semiconductor layer 9 and the semiconductor substrate 8, as shown in FIG. 5(b). Therefore, measurement is not affected by the quantity of the free carriers in the semiconductor.

On the other hand, when light in a frequency region which causes absorption by the free carriers in the carrier-doped semiconductor layer 9 is used as light for ellipsometry, absorption of light (the frequency band and the absorption coefficient $k_2$ of the absorbed light) changes with the quantity of the free carriers in the semiconductor. This corresponds to changes in the index of refraction $n_2$ of the carrier-doped semiconductor layer 9 with the carrier concentration $N_c$. The use of light in a wavelength region which causes absorption by the free carriers as measurement light causes the light receiving device 6 to measure the light L2 reflected by the surface of the carrier-doped semiconductor layer 9 and the light reflected by the interface between the carrier-doped semiconductor layer 9 and the semiconductor substrate 8. (Although not shown in FIGS. 5(a) and (b), multiple reflected light is also received by the light receiving device 6, as described above). The quantity of reflected light measured by the light receiving device 6 changes with the carrier concentration $N_c$ of the carrier-doped semiconductor layer 9. Therefore, when the above-described evaluation method is executed by ellipsometric measurement using, as measurement light, light in a frequency region which causes light absorption by free carriers, the carrier concentration $N_c$ and the thickness d of the carrier-doped semiconductor layer 9 can simultaneously be measured.

Further, in ellipsometry, when light having a frequency which causes a difference between the complex indexes of $n_2^*$ of refraction of the semiconductor substrate 8 such as a semi-insulating GaAs substrate, a Si substrate or the like, and the carrier-doped semiconductor layer 9 such as a n-type GaAs epitaxial layer, a n-type or p-type Si layer or the like is used as measurement light, even for a homoepitaxial layer, the thickness of the carrier-doped semiconductor layer 9 can be measured. For example, for a n-type GaAs layer formed on a semi-insulating GaAs substrate, measurement by infrared spectroscopic ellipsometry using infrared light having a wavelength of about 5 to 10 micrometers enables measurement of the thickness of the n-type GaAs substrate which is a homoepitaxial layer.

Although a conventional method requires a time of as long as 1 hour or more to obtain results from preparation for inspection, the method of the present invention can obtain results of inspection within several minutes since ellipsometric measurement and computation of the carrier concentration $N_c$ and the thickness d by curve fitting using a computer can be carried out within several seconds, and thus the time required for inspection can significantly be decreased.

Wavelength of Light Used for Ellipsometry

Light is absorbed by free carriers in the vicinity of a wavelength corresponding to the plasma angular frequency $\omega_p$. Therefore, the wavelength of the light used for ellipsometric measurement must contain the entirety or part of a wavelength region which causes light absorption, and the value of the plasma angular frequency shown by equation (11) becomes a measure. Namely, since values described in existing documents and data can be used as the values of the carrier effective mass m* and the dielectric constant $\in_{opt}$ in accordance with the type of the semiconductor material used for the substrate 2 as the measurement object, the plasma angular frequency $\omega_p$ shown by equation (11) can be determined by assuming an appropriate value as the carrier concentration $N_c$. The thus-determined plasma angular frequency $\omega_p$ can be converted into the wavelength of light $\lambda_p=(2\pi c/\omega_p)$ (wherein c is the velocity of light in vacuum). The wavelength of the light used for ellipsometric measurement is preferably selected in a wavelength region containing this wavelength $\lambda_p$ or the vicinity thereof. The dielectric constant $\in_{opt}$ is preferably selected in a frequency region sufficiently higher than the plasma angular frequency $\omega_p$.

For example, when it is assumed that electrons in a n-type GaAs layer are carriers, the effective mass m*=0.067 $m_0$ (wherein $m_0$ is the rest mass of electrons), and the dielectric constant $\in_{opt}$=about 10.9 are often used. Therefore, assuming that the carrier concentration $N_c=10^{18}$ cm$^{-3}$, the plasma angular frequency $\omega_p$ can be computed by equation (11), and the wavelength $\lambda_p$ of light corresponding to this plasma angular frequency $\omega_p$ is about 28.5 micrometers (a wave number $1/\lambda_p$ of about 350 cm$^{-1}$).

Since $\in_{opt}$ is the dielectric constant in a very high frequency region, i.e., such a high frequency region that carriers cannot sufficiently follow a change in an electric field, the value of $\in_{opt}$ can be considered as constant regardless of the carrier concentration $N_c$. Also the complex index $n_3^*$ of refraction of the semiconductor substrate 8 can be represented by the same equation as equation (9), and light absorption by the semiconductor substrate 8 can be neglected. Thus the complex index of refraction of the semiconductor substrate 8 can be represented by $n_3^*=\sqrt{(\in_{opt})}$, as described above.

Correction with Consideration of Phonon

When a semiconductor material other than GaAs is used or when the wavelength region of the light used for measurement is different, measurement is sometimes affected by absorption by another absorption mechanism in a portion such as the carrier-doped semiconductor layer 9 or the semiconductor substrate 8, e.g., absorption by LO phonon and TO phonon. In such a case, it is necessary to add a correction item which indicates the effect of the absorption mechanism to the defining equation of each of the complex indexes of refraction.

For example, when the absorption mechanism by LO phonon and TO phonon is taken into consideration, it is necessary to use the following equations (14a) or (14b) in place of equation (9) as the complex index $n_2^*$ of the carrier-doped semiconductor layer 9.

$$(n_2^*)^2 = \epsilon_{opt}\left(1 - \frac{\omega_P^2}{\omega^2 + i\omega\gamma_{pl}} + \frac{\omega_{LO}^2 - \omega_{TO}^2}{\omega_{TO}^2 - \omega^2 - i\omega\gamma_{ph}}\right) \quad (14a)$$

$$(n_2^*)^2 = \epsilon_{opt} \cdot \frac{(\omega^2 + i\Gamma_- \cdot \omega - \omega_-^2)(\omega^2 + i\Gamma_+ \cdot \omega - \omega_+^2)}{\omega(\omega + i\gamma)(\omega^2 + i\gamma_{ph} \cdot \omega - \omega_{TO}^2)} \quad (14b)$$

wherein, $$\omega_\pm^2 = \frac{\omega_{LO}^2 + \omega_P^2}{2} \pm \left[\left(\frac{\omega_{LO}^2 + \omega_P^2}{2}\right)^2 - \omega_p^2 \cdot \omega_{TO}^2\right]^{1/2}$$

In equation (14a) and (14b), $\omega_{LO}$ and $\omega_{TO}$ are the angular frequencies of LO phonon and TO phonon, respectively, $\gamma_{ph}$ is the damping constant of resonance by phonon, $\omega_+$ and $\omega_-$ are the angular frequencies of the mode that plasmon and phonon are coupled, and $\Gamma_+$ and $\Gamma_-$ are the damping constant of the coupling mode of $\omega_+$ and $\omega_-$, respectively.

Multilayer Film Comprising Carrier-Doped Semiconductor Layers

Figure 6:
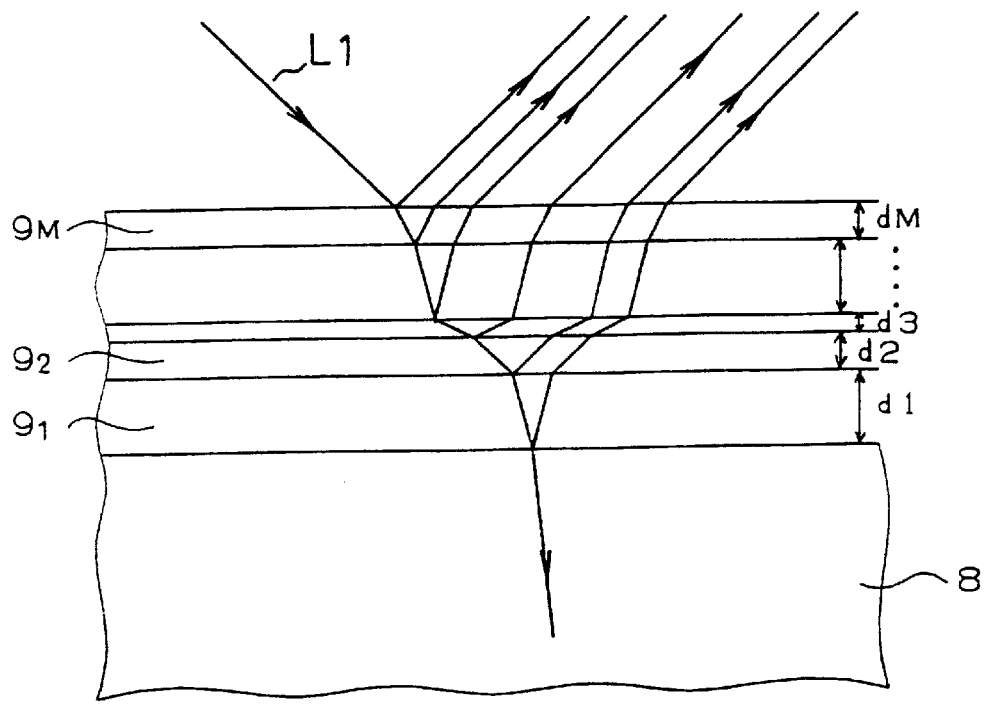
FIG. 6 is a schematic view showing the case of a multilayer structure carrier-doped semiconductor layer.

FIG. 6 shows a case where a multilayer film having carrier-doped semiconductor layers $9_1$ to $9_M$ is formed on the semiconductor substrate 8. When the ellipsometric measurement of the present invention is used for such a multilayer film, it is necessary to compute reflection (Although not shown in FIG. 6, reflection includes multiple reflection) in the interfaces between the respective carrier-doped semiconductor layers $9_1$ to $9_M$, and compute the whole reflected light reflected by the surface when light is incident on the surface.

As shown in FIG. 6, it is assumed that the M carrier-doped semiconductor layers $9_1, 9_2, \ldots$ having a complex index $n_q^*$ and a thickness $d_q$ (q=1, 2, ... M) are deposited in turn on the semiconductor substrate 8 having a vector $n_0^*$ of a complex index of refraction. It is also assumed that when q-1 carrier-doped semiconductor layers $9_1, 9_2, \ldots 9_{q-1}$ are formed on the semiconductor substrate 8, and when light is incident from the carrier-doped semiconductor layer $9_q$ on these semiconductor layers, which has a complex index $n_q^*$ of refraction, the complex amplitude reflectance ratio is $\rho_{q,0}$. When a carrier-doped semiconductor layer $9_{q+1}$, having a complex index $n_{q+1}^*$ of refraction is further deposited on the carrier-doped semiconductor layer $9_q$ having a complex index $n_q^*$ of refraction (thickness $d_q$), and light is incident on the carrier-doped semiconductor layer $9_{q+1}$, the complex amplitude reflectance ratio $\rho_{q+1,0}$ is given by a recurrence formula represented by the equation (15) as follows:

$$\rho_{q+1,0} = \frac{R^P_{q+1,0}}{R^S_{q+1,0}} \tag{15}$$

$$= \frac{r^P_{q+1,q} + R^P_{q,0} \cdot \exp(-2i\delta_q)}{1 + r^P_{q+1,q} \cdot R^P_{q,0} \cdot \exp(-2i\delta_q)} \times$$

$$\frac{1 + r^S_{q+1,q} + R^S_{q,0} \cdot \exp(-2i\delta_q)}{r^S_{q+1,q} + R^S_{q,0} \cdot \exp(-2i\delta_q)}$$

wherein $$R^P_{q,0} = \frac{r^P_{q,q-1} + R^P_{q-1,0} \cdot \exp(-2i\delta_{q-1})}{1 + r^P_{q,q-1} \cdot R^P_{q-1,0} \cdot \exp(-2i\delta_{q-1})} \tag{16}$$

$$R^S_{q,0} = \frac{r^S_{q,q-1} + R^S_{q-1,0} \cdot \exp(-2i\delta_{q-1})}{1 + r^S_{q,q-1} \cdot R^S_{q-1,0} \cdot \exp(-2i\delta_{q-1})}$$

$$r^P_{q,q-1} = \frac{n^*_{q-1}\cos\phi_q - n^*_q\cos\phi_{q-1}}{n^*_q\cos\phi_{q-1} + n^*_{q-1}\cos\phi_q}$$

$$r^3_{q,q-1} = \frac{n^*_q\cos\phi_q - n^*_{q-1}\cos\phi_{q-1}}{n^*_q\cos\phi_q + n^*_{q-1}\cos\phi_{q-1}}$$

$$\delta_q = 2\pi \frac{d}{\lambda} \sqrt{(n^*_q)^2 - \sin^2\phi_{q+1}}$$

In equation (15), $\phi_q$ is an angle of refraction in the qth carrier-doped semiconductor layer $9_q$.

Figure 7:
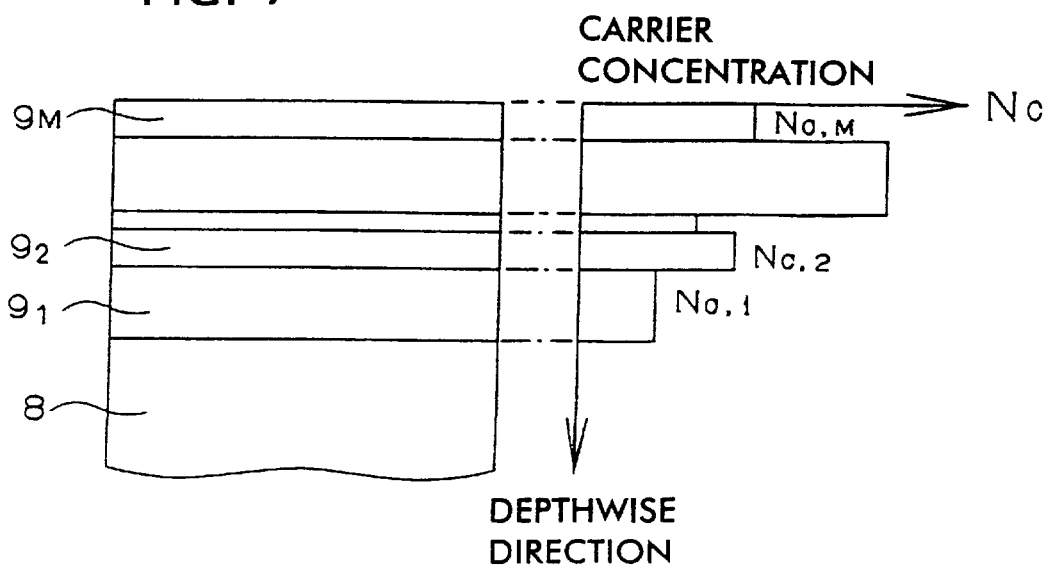
FIG. 7 is a drawing showing the multilayer structure carrier-doped semiconductor layer and the carrier concentration of each of the layers thereof.

For the interface between air and the uppermost carrier-doped semiconductor layer $9_M$, the interfaces between the respective carrier-doped semiconductor layers $9_1, 9_2, \ldots, 9_M$ and the interface between the carrier-doped semiconductor layer $9_1$ and the semiconductor substrate 8, reflection is considered by recurrence formula (15), and the complex amplitude reflectance ratio $\rho_{q,0}$ (q=1, ..., M) of each of the carrier-doped semiconductor layers $9_1, 9_2, \ldots, 9_M$ is given by the recurrence formula (15). With respect to these values, curve fitting is carried out by comparing measured values and computed values so that errors are minimized in the same way as the above-described single carried-doped semiconductor layer 9 described before. As a result, the carrier concentration $N_{c,q}$ of each of the carrier-doped semiconductor layers $9_q$ can be determined, as shown in FIG. 7.

This method is also a method using ellipsometry, but when this method is performed in a wavelength region causing absorption by free carriers, a difference in the complex index of refraction due to a difference in the carrier concentration can be obtained, and thus the thickness $d_q$ and the carrier concentration $N_{c,q}$ of each of the carrier-doped semiconductor layers $9_q$ in a multilayer film can be determined.

Therefore, the method of measuring carrier concentrations of the present invention is capable of simultaneously measuring, in a non-contact, non-destructive manner, the carrier concentration and the thickness of each of a plurality of carrier-doped semiconductor layers containing different amounts of the dissimilar materials and impurities added.

Measurement of Carrier Concentrations

Figure 8:
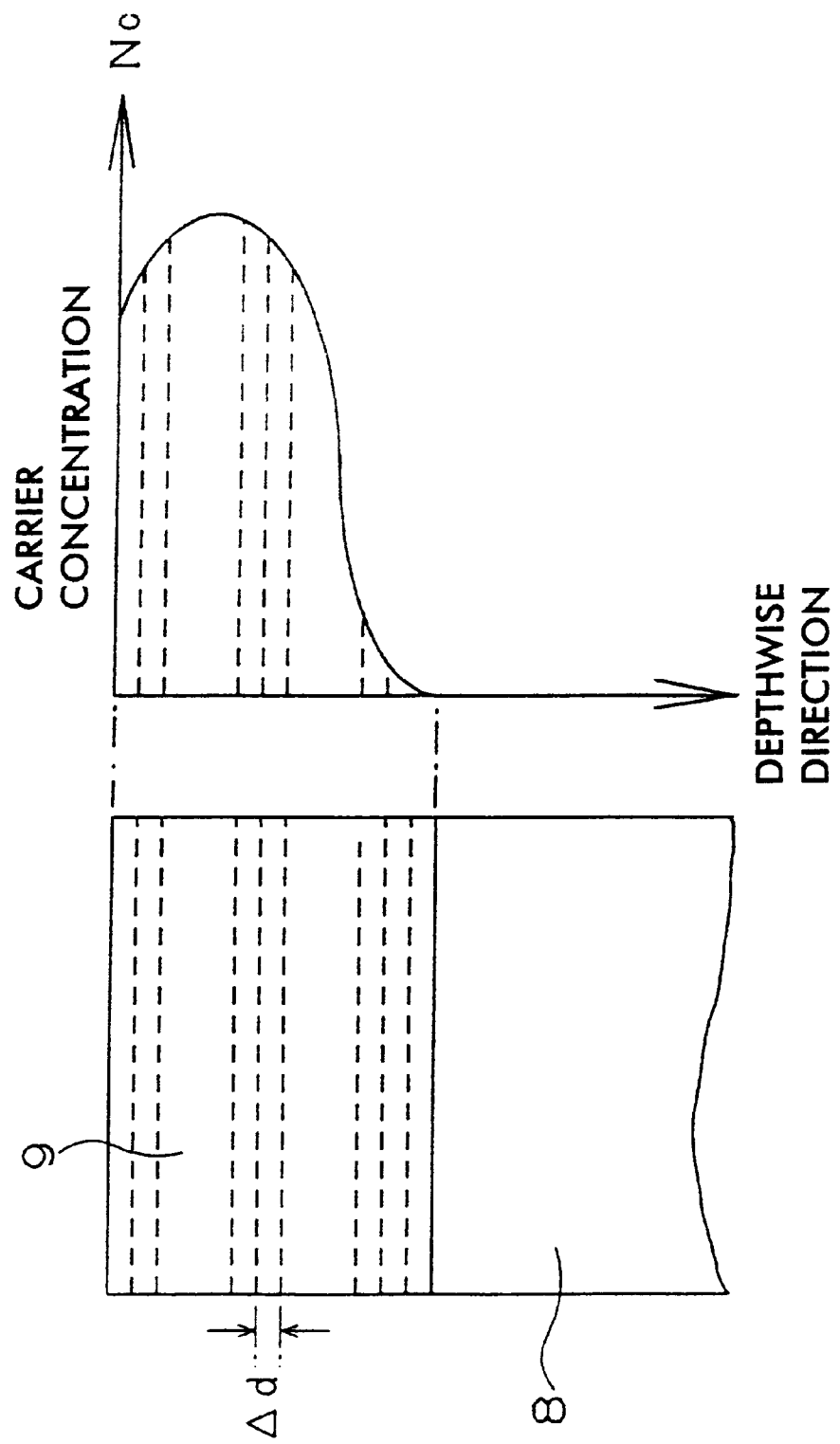
FIG. 8 is a drawing showing the distribution (profile) of the carrier concentrations of a carrier-doped semiconductor layer.

A case where the carrier-doped semiconductor layer 9 having a distribution of carrier concentrations in the thickness direction thereof is formed on the semiconductor substrate 8 is considered, as shown in FIG. 8. For example, a case where an active layer formed by ion implantation and diffusion has a distribution of carrier concentrations $N_c$ is considered. In such a case, the carrier-doped semiconductor layer 9 is divided into a plurality of layers having an appropriate thickness, for example, a constant thickness $\Delta d$, and the carrier concentration of each of the virtually divided layers can be obtained by handling each of the divided layers in the same manner as in the multilayer film. Therefore, the depthwise position and the carrier concentration $N_c$ in the carrier-doped semiconductor layer 9 can be obtained, and thus a profile of carrier concentrations along the thickness direction (depthwise direction) can be determined, as shown in FIG. 8.

Therefore, the method of measuring carrier concentrations of the present invention is capable of simultaneously measuring, in a non-contact, non-destruction manner, the profile of carrier concentrations and the thickness of a semiconductor active layer or the like formed by, for example, ion implantation and diffusion of ions in a GaAs substrate.

Process for Manufacturing Semiconductor Device

Figure 9:
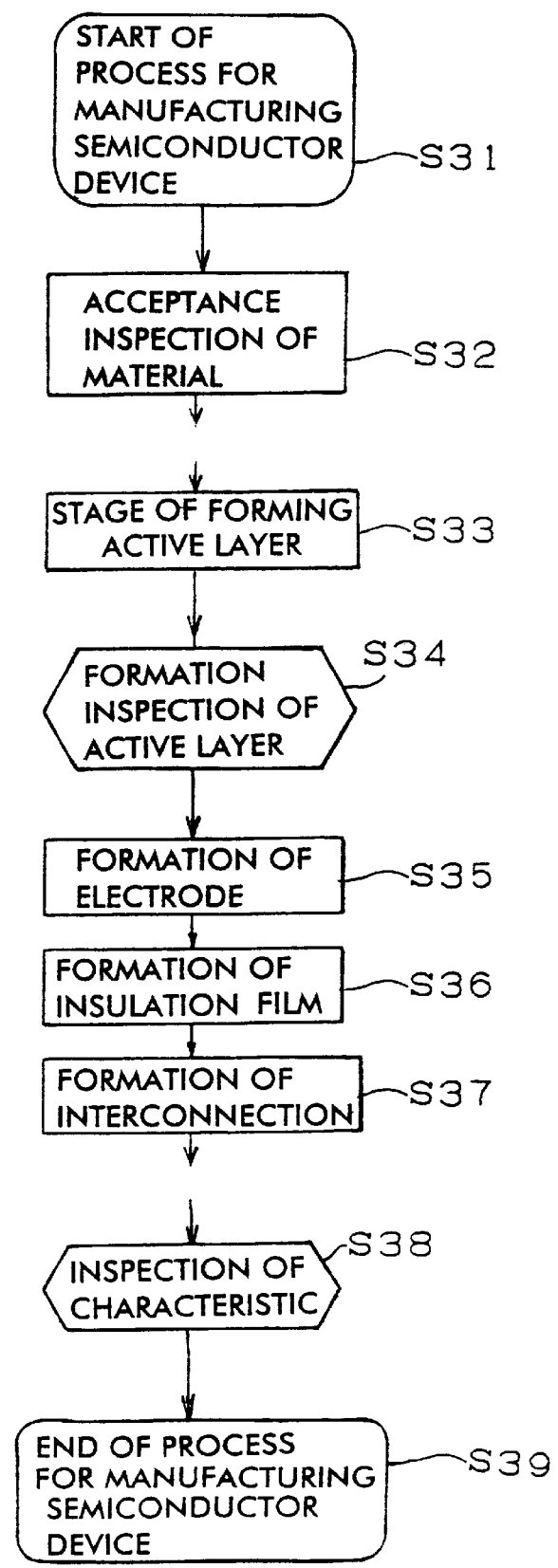
FIG. 9 is a schematic flowchart showing a process for manufacturing a semiconductor device in accordance with the present invention.

FIG. 9 is a flowchart schematically showing the process for manufacturing a semiconductor device using the method of measuring carrier concentrations of the present invention. As shown in FIG. 9, when the process for manufacturing a semiconductor device is started (S31), after acceptance inspection (S32) of a material such as a wafer (the semiconductor substrate 8) or the like, an active layer is formed on the semiconductor substrate 8 by crystal growth or ion implantation (S33). After the active layer is formed, the active layer is inspected by the method of measuring carrier concentrations of the present invention in in-situ inspection (S34). Namely, the thickness, the carrier concentration or the profile of carrier concentrations of the active layer are measured by a non-contact, non-destructive method in in-situ inspection to check whether the predetermined active layer is formed. If the active layer passes this inspection, another necessary structure is formed, an electrode is formed on the surface (S35), and an insulating layer is formed on the electrode (S36). A semiconductor chip obtained by dicing cut of the wafer is packaged in a package, and interconnection is provided by wire bonding or the like (S37) to manufacture a semiconductor device. Then, the characteristics of the semiconductor device are checked (S38), and the process for manufacturing the semiconductor device is finished (S39).

In a conventional method of measuring carrier concentrations, destructive inspection necessitates the formation of a separate wafer for inspection. However, in the method of measuring carrier concentrations of the present invention, non-contact, non-destruction inspection enables in-situ inspection, inspection of all wafers and accurate and precise process control. Therefore, the method of the present invention eliminates the need for a wafer for inspection.

Also the method of the present invention is capable of obtaining results of inspection within several minutes, and improving the throughput of the process for manufacturing semiconductor devices. Further, a conventional method uses one wafer per lot for inspection, but the method of the present invention permits inspection of each of all wafers, and reliable removal of a wafer in which a defective active layer is formed.

Further, since wafers for actually manufacturing semiconductor devices can be respectively inspected, it is possible to securely remove a wafer in which a defective active layer is formed, and easily detect a failure in an early stage.

Even if a film through which light is partially transmitted in the frequency region of the measurement light, such as a $SiO_2$ or $SiN_x$ film, is formed on the active layer, information about the film is previously input, and the measurement method of the present invention is performed in a state where the presence of the film is defined, so that the active layer can be evaluated. This corresponds to a case when a film used for activation annealing after ion implantation or a film through which ion implantation is performed is subjected to the next process without being removed. In this case, the inspection method in accordance with the present invention is an only possible inspection method and very effective means.

Guarantee of Semiconductor Wafer

The profile of carrier concentrations (or the carrier concentration and the thickness) of the manufactured semiconductor wafer is measured by using the method of measuring carrier concentrations of the present invention, and shipment inspection is carried out by comparing with the specifications of products on the basis of the results of measurement. If it is decided from the results of inspection that the semiconductor wafer passes the standards, the performance of the semiconductor wafer is guaranteed. Specifically, guarantee of the semiconductor wafer is indicated by applying a performance guarantee to the semiconductor wafer. The thus-guaranteed semiconductor wafer has higher reliability than a wafer guaranteed by destructive inspection using the characteristic values obtained by using another wafer.

In some cases, regions (a region containing carriers to which impurities are added, an active region) which relate to the device operation, are produced in a semiconductor wafer by a wafer manufacturer, and then the wafer is shipped. In order to guarantee of the finish state of the wafer, for example, a wafer produced in the same lot has been so far sacrificed for evaluation by a destructive test before shipment. In this case, since the wafer actually used by the user (the wafer buyer) is different from the wafer used for guarantee, absolute guarantee is impossible. On the other hand, inspection using the method of measuring carrier concentrations of the present invention enables measurement of the profile of carrier concentrations (or the carrier concentration and the thickness) of the wafer actually used by the user, and thus guarantee with high reliability can be made.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of simultaneously measuring a free carrier concentration and a depthwise position which has said free carrier concentration in a layer of a semiconductor, comprising the steps of:

(a) irradiating said layer of said semiconductor with light having at least a frequency band which causes light absorption by said free carriers in said semiconductor;

(b) optically measuring light reflected from said layer of said semiconductor; and (c) determining said carrier concentration and said depthwise position from the measurement in step (b), wherein in the steps (b) and (c) a reflection amplitude ration (tan $\Psi$) and a phase ($\Delta$) of a complex amplitude reflectance ratio ($\rho$) are measured at several points with a plurality of wavelength by ellipsometry, and;

the free carrier concentration ($N_c$), the thickness (d) and the damping constant ($\lambda_{pl}$) are determined by a curve fitting method;

the curve fitting method including:
      obtaining a complex amplitude reflectance ration ($\rho m$) determined by the measured reflection amplitude ratio (tan $\Psi$) and phase ($\Delta$);
      obtaining a complex amplitude reflectance ratio ($\rho c$) determined by selecting appropriate values of the free carrier concentration ($N_c$), a thickness (d) which represents the depthwise position and a damping and a damping constant ($\lambda$pl);
      determining the residual sum of squares of each of the real part and the imaginary part of each of the complex amplitude reflectance ratios ($\rho m$) and ($\rho c$) as an error evaluation function, and
      considering the free carrier concentration ($N_c$) the thickness (d) and the damping constant ($\lambda$pl) when an error evaluated by the error evaluation function is lower than a permissible value as measurements.

2. A process of manufacturing a semiconductor device comprising the steps of:

controlling a process of forming a semiconductor active layer by using the method according to claim 1.

3. A semiconductor wafer inspected by using the method according to claim 1, and having guaranteed performance based on the results of inspection.

4. The method according to claim 1, characterized in that said semiconductor has a multilayer structure, each layer having a depthwise position and a concentration of free carriers and that in step (c) each carrier concentration and depthwise position of each layer of said semiconductor is determined.

5. A process of manufacturing a semiconductor device comprising the steps of:

controlling a process of forming a semiconductor active layer by using the method according to claim 4.

6. A semiconductor wafer inspected by using the method according to claim 4, and having guaranteed performance based on the results of inspection.

* * * * *